(12) United States Patent
Dallmann

(10) Patent No.: US 9,369,314 B2
(45) Date of Patent: Jun. 14, 2016

(54) GENERATION OF MANCHESTER-DECODED BINARY VALUES

(71) Applicant: Infineon Technologies AG, Neubiberg (DE)

(72) Inventor: Achim Dallmann, Baldham (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/728,169

(22) Filed: Jun. 2, 2015

(65) Prior Publication Data

US 2015/0349985 A1    Dec. 3, 2015

(30) Foreign Application Priority Data

Jun. 2, 2014   (DE) .................... 10 2014 007 819
Apr. 21, 2015  (DE) .................... 10 2015 005 087

(51) Int. Cl.
  *H04L 27/06*   (2006.01)
  *H04L 25/03*   (2006.01)
  *H03M 5/12*    (2006.01)

(52) U.S. Cl.
  CPC .......... *H04L 25/03286* (2013.01); *H03M 5/12* (2013.01)

(58) Field of Classification Search
  CPC ... H04L 25/4904; H04L 7/033; H04L 7/0066; H03M 5/12; H03M 5/02
  USPC ................. 375/340, 359, 360, 361, 282, 333
  See application file for complete search history.

(56) References Cited

U.S. PATENT DOCUMENTS

| | | | |
|---|---|---|---|
| 4,746,898 | A  | 5/1988 | Loeppert |
| 2006/0002429 | A1 | 1/2006 | Doddamane et al. |

FOREIGN PATENT DOCUMENTS

| | | |
|---|---|---|
| EP | 0266285 B1 | 7/1992 |
| JP | 63139428 A | 6/1988 |

*Primary Examiner* — Daniel Washburn
*Assistant Examiner* — Fitwi Hailegiorgis
(74) *Attorney, Agent, or Firm* — Eschweiler & Associates, LLC

(57) ABSTRACT

A method for generating Manchester-decoded binary values is disclosed, in which a signal having signal edges is first of all read in. A first sequence of decoded binary values is then generated by means of first Manchester decoding, in which a decoded binary value is allocated to each signal edge of the signal. A second sequence of decoded binary values is then generated by means of second Manchester decoding, in which a decoded binary value is allocated to every second signal edge. The second sequence is rejected if a signal edge of the signal which is not allowed with respect to the second Manchester decoding occurs. The first sequence is rejected if a signal edge of the signal which is required with respect to the first Manchester decoding is missing.

17 Claims, 9 Drawing Sheets

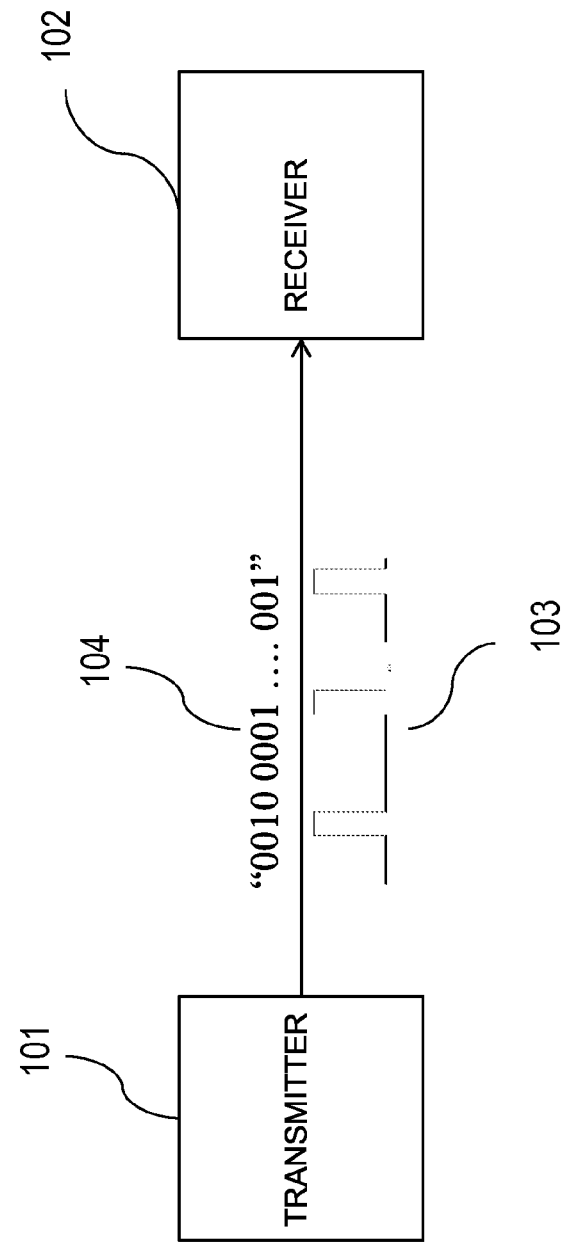
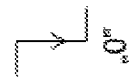
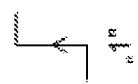

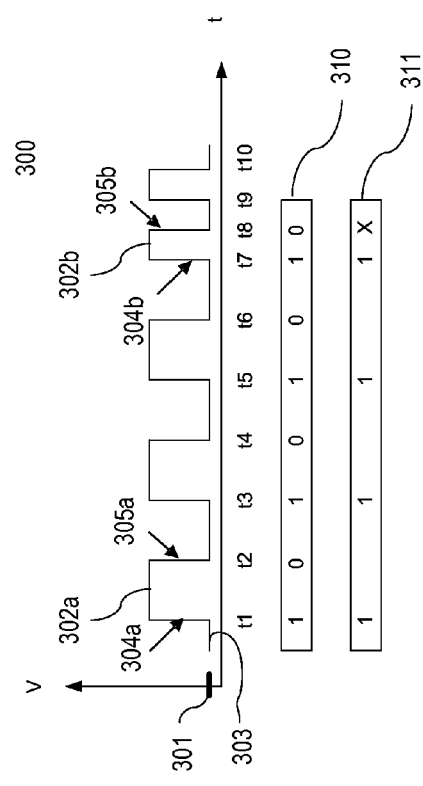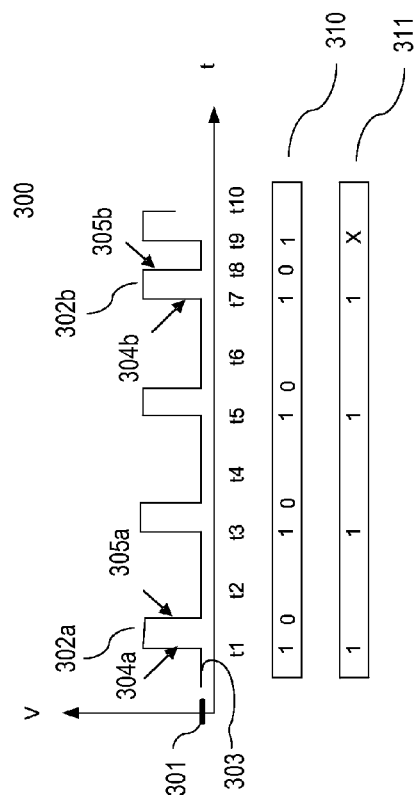

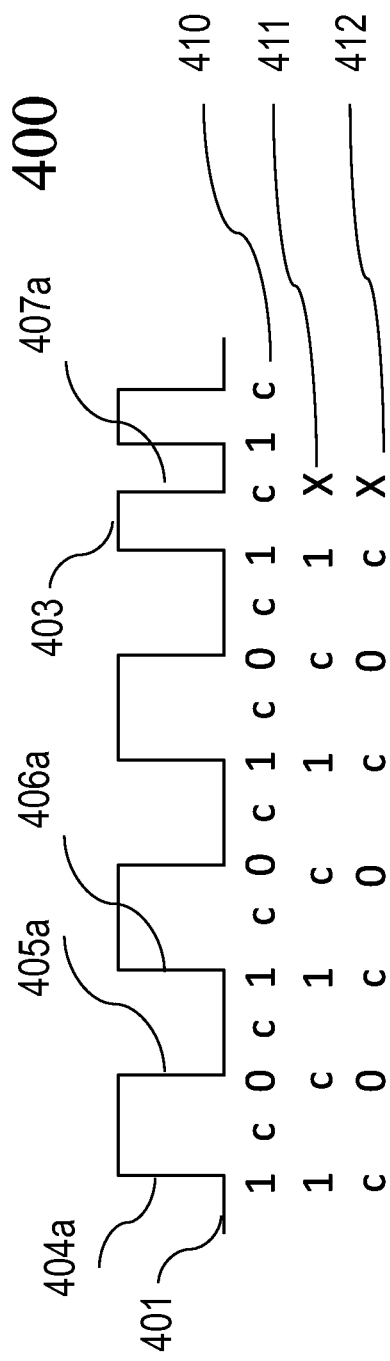

GENERATION OF MANCHESTER-DECODED BINARY VALUES

CROSS REFERENCE TO RELATED APPLICATIONS

This application claims priority to German Application number 102014007819.1, filed on Jun. 2, 2014 and German Application number 102015005087.7, filed on Apr. 21, 2015.

FIELD

The invention relates to a method and an apparatus for generating Manchester-decoded binary values. Further embodiments relate to a system having a transmitter and a receiver as well as a microprocessor and to a subassembly having a microprocessor on which the described method is implemented.

BACKGROUND

A line code is needed to transmit digital information on physical media from a transmitter to a receiver. Particular physical states of the line can therefore be assigned to binary data. In the case of electrical lines, two different electrical voltages, for example, are used to code a logical "0" and a logical "1" in a serial data stream. The task of the line code is to adapt the data stream to be transmitted to the transmission medium.

During Manchester coding, the logical data "0" and "1" are not coded by an individual voltage level on the electrical line but rather by a voltage edge, that is to say a signal change. In one embodiment of Manchester coding, a logical "1" corresponds to a positive signal change and a logical "0" corresponds to a negative signal change. Correction edges are inserted in the case of successively identical data. The Manchester code thus requires a sequence of "0" and "1" values to also be detected by changing edges.

An advantage of Manchester coding over other line codes is that the clock on which the data are based is implicitly concomitantly transmitted with the transmission of the binary data and the data can be transmitted largely without a DC component. A simple possible way of generating a Manchester code is to use XOR operations between the clock signal present at the transmitter end and the binary data to be transmitted.

At the receiver end, the clock must be determined from the coded signal so that the reception signal can be sampled in the correct phase and the correction edges can be eliminated. In the case of Manchester-coded signals, a series of signal edges must generally be detected for this purpose. The actual transmission of useful data can be started only after the clock has been determined and a clock generation unit at the reception end has been synchronized.

The European patent EP0266085B1 discloses a method in which a special bit string (header) known to the receiver is transmitted. This bit string is then used to synchronize the receiver.

The object of the present invention is to provide a method and an apparatus, with which it becomes possible to decode Manchester-coded signals without using a predetermined, special bit string for synchronization.

SUMMARY

A method for generating Manchester-decoded binary values is disclosed, in which a signal having signal edges is first of all read in. A first sequence of decoded binary values is then generated by means of first Manchester decoding, in which a decoded binary value is allocated to each signal edge of the signal. A second sequence of decoded binary values is then generated by means of second Manchester decoding, in which a decoded binary value is allocated to every second signal edge. The second sequence is rejected if a signal edge of the signal which is not allowed with respect to the second Manchester decoding occurs. The first sequence is rejected if a signal edge of the signal which is required with respect to the first Manchester decoding is missing.

BRIEF DESCRIPTION OF THE DRAWINGS

FIG. 1 shows a known system for transmitting binary data without Manchester coding.

FIGS. 2a and 2b show a rising signal edge and a falling signal edge according to known Manchester coding.

FIG. 3a shows one embodiment with two data sequences in a signal profile with Manchester coding, the signal profile consisting of initially longer pulses having a duty cycle of 50% and a low quiescent value.

FIG. 3b shows another embodiment with two data sequences in a signal profile with Manchester coding, the signal profile consisting of initially longer pulses having a duty cycle of 25% and a low quiescent value.

FIG. 4 shows one embodiment with three data sequences, the signal profile consisting of initially longer pulses.

DETAILED DESCRIPTION

Figure 5:
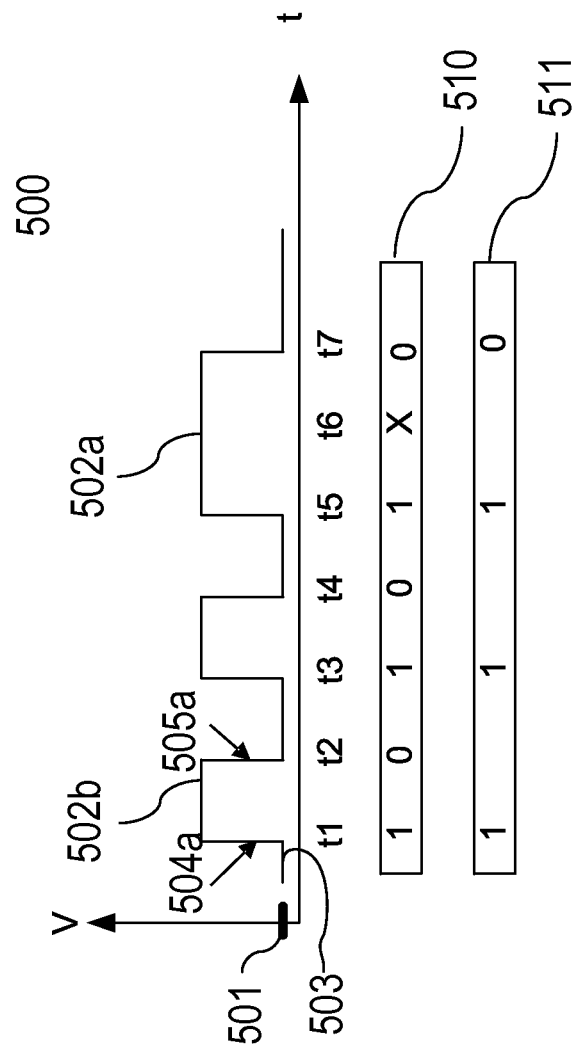
FIG. 5 shows one embodiment with two data sequences, the signal profile consisting of initially shorter pulses.

The following detailed description refers to the accompanying drawings which form part of the disclosure of the invention and, for the purpose of illustration, show special exemplary embodiments which can be used to practically implement the invention, by way of example. It goes without saying that other exemplary embodiments can be used and structural or other changes can be made without departing from the scope of protection of the present invention. Therefore, the following detailed description should not be understood in a restrictive manner. Rather, the scope of protection of the present invention is defined only by the accompanying patent claims.

The receiver of a Manchester-coded signal generally has knowledge of the approximate data rate. In a 10 Base-T Ethernet-based system according to IEEE 802.3, the receiver knows, for example, that the data arrive approximately at a rate of 10 Mbit per second. However, considerable deviations from this frequency may also result owing to different interference when transmitting the data. For this reason, synchronization must fundamentally take place before sampling the incoming analog data signal, during which synchronization the internal clock for sampling the received data is determined.

FIG. 1 shows a generally known system 100 having a transmitter 101 and a receiver 102. The transmitter 101 transmits a sequence of binary data or data bits 104 to the receiver 102. For this purpose, the voltage of an electrical signal 103 is changed and the signal is transmitted. The signal 103 may be an analog signal in which particular properties of the signal are changed according to the binary data 104 to be transmitted. For example, the signal 103 may consist of pulses and the binary data 104 may be coded using changes in the amplitude of the signal 103. The sequence of pulses may represent a square-wave signal which changes periodically with a period duration T over a limited period. The duty cycle of the individual pulses may be 50% but may also increase and decrease. The coding of binary data 104 using the signal edges of the pulses of the signal 103 is referred to as Manchester coding.

FIGS. 2a and 2b show a known example of Manchester coding. For example, a logical "1" is coded using a rising signal edge and a logical "0" is coded using a falling signal edge. According to appropriate agreement between the transmitter and the receiver, the assignment between the signal edge and the binary value can also be inverted.

During Manchester coding, a transmitter codes a digital binary value, which is in the form of a logical "0" or a logical "1", using the edge of an electrical signal, for example the voltage or the current, and transmits it to one or more receivers. For example, a rising voltage edge may code a logical "1" and a falling voltage edge may code a logical "0". According to the agreement, the assignment of edge type to logical value may also be carried out the other way round.

The edge coding converts a sequence of logical "1" data into a sequence of voltage pulses each having a rising or positive edge, for example. The duration of a pulse is the time from one rising edge to the next falling edge. The pulse spacing or the pulse period duration corresponds to the spacing between two rising edges.

For example, two successive logical "1", that is to say the data "11", may need to be coded, in which case a logical "1" is intended to be coded as a rising edge, for example. In accordance with Manchester coding, a voltage pulse must fall to its starting level again after a positive edge has been transmitted and before a second positive edge is transmitted. In this case, the strictly necessary falling or negative edge does not code a binary data item and is therefore a correction edge. A corresponding correction edge is also necessary if two successive logical "0", that is to say the data "00", need to be coded.

A corresponding situation applies to an assignment of a rising edge to a logical "0" and a falling edge to a logical "1". In this case too, correction edges need to be integrated in the signal in the event of successive identical binary values.

In contrast, if the binary sequence "10" is coded using the described system of a Manchester code, a voltage pulse is produced on the line, in which the positive or rising edge codes the "1" and in which the falling or negative edge codes the "0".

The receiver of a single voltage pulse exhibiting a rising edge and a falling edge therefore cannot decide, without further information relating to the underlying clock frequency, whether an individual "1" or a "10" sequence of data has been transmitted. Even if the receiver receives a plurality of voltage pulses of equal length or approximately equal length, it is unclear whether they are short or long pulses in practice. That is to say, the decision as to whether the received edges are correction edges or coded binary values is initially not possible.

The clock can be clearly reconstructed only with the reception of a plurality of voltage pulses having a significantly different duration. If, for example, the data "1011" are coded, a longer pulse first of all occurs and is followed by two shorter pulses. It becomes clear only with the detection of the shorter pulses or the corresponding pulse spacings that the first pulse was a relatively long pulse. The clock and therefore the correct data which can be used further can be reconstructed or decoded from this knowledge.

For the reasons mentioned, a transmitter cannot immediately start to transmit useful data to a receiver without the described method. The receiver requires a certain number of data items before it is able to correctly interpret the transmitted binary data. It is therefore known practice to first of all transmit a predefined synchronization word, for example the word "1010 1010", to the receiver before the useful data are transmitted. A predefined synchronization word is also known under the term "header".

This disclosure uses the fact that there are only two different interpretations of the received signal edges or pulses in the case of Manchester-coded binary data. The first received voltage pulse is either a relatively long pulse for the sequence "10" or is a relatively short pulse which represents a logical "1" and is then followed by a logical "1" again.

A method is therefore presented in which a signal having rising and falling signal edges is read and is then decoded by means of two Manchester decoding operations. In this case, the first Manchester coding interprets each signal edge as a coded binary value. The second Manchester coding interprets only every second edge as a coded binary value and interprets the other edges as correction edges. One of the two decoding operations subsequently proves to be defective.

In the first Manchester decoding, it is assumed that the first received pulses are long pulses. In other words, it is assumed in the first Manchester decoding that the occurring edges of the received signal are not correction edges but rather represent alternating binary data, for example the sequence "1010" etc. It is therefore assumed in the first Manchester decoding that there must be a correction edge at a particular time, which correction edge then defines a short pulse.

In the second Manchester decoding, it is assumed that the first received pulses are short pulses. That is to say, there must always also be a correction edge in the case of two successive edges. In this interpretation of the received signal, signal edges and correction edges are allowed only at particular times. If a signal edge now occurs too early at a time which is not allowed, it is clear that the interpretation of the second Manchester decoding is not correct in this case.

According to the two possible decoding situations, the bits assigned to the edges may be assigned to at least two data sequences. One data sequence is generated by allocating a decoded binary value to each signal edge of the signal. A second sequence of decoded binary values is generated by means of second Manchester decoding, in which a decoded binary value is allocated to every second signal edge of the signal. The occurrence of a signal edge at a time which is not allowed in the second Manchester decoding shows that the first sequence has been effected on the basis of correct Manchester decoding and only the last value does not represent a decoded binary value but rather must be assigned to a correction edge. The first sequence should be rejected if an edge required for the first Manchester decoding is missing.

FIGS. 3a and 3b each show, by way of example, one embodiment 300 having a voltage profile plotted against the time t. The respective voltage profile shows a signal 303 which represents an electrical voltage which changes over time. The signal 303 respectively starts at a basic value 301 which may be 0 V for example or may have another voltage value.

The signal 303 represents a Manchester-coded binary data sequence in the form of voltage pulses (302a, 302b) having signal edges (304a, 304b, 305a, 305b). In one simple implementation of Manchester coding, a binary signal to be coded is supplied, for example, together with a clock signal at a particular frequency, to an XOR circuit element which carries out an "exclusive OR" function. The output signal from such an XOR element may correspond to a signal profile 303. In this case, the signal 303 in FIG. 3a shows pulses which have a high voltage value and a low voltage value in approximately equal proportions, that is to say have a duty cycle of 50%. In the example in FIG. 3b, the signal 303 has a duty cycle of 25%.

The problem during decoding, for example by means of a receiver not illustrated in FIGS. 3a and 3b, lies in deciding, without knowledge of the clock frequency used in the coder when the first pulse 302a arrives, whether the two edges 304a and 305a have been produced from the binary values "1" and "0" on the basis of Manchester coding. It would also be possible for the second occurring edge 305a to not have been produced by coding a binary value but rather to represent only necessary falling to the basic value 301 in order to be able to represent a Manchester-coded "1" again with the next rising edge. In this case, the second edge 305a does not code a binary value but rather constitutes only a correction edge. In other words, it is unclear, upon receiving a first pulse of a received signal, whether a relatively long pulse or a relatively short pulse is involved and whether or not the second edge is a correction edge.

A relatively long pulse has a greater pulse period duration than the relatively short pulse. The pulse period duration of the first pulse 302a is the period between two rising edges, that is to say between the times t1 and t3. The pulse period duration of the pulse 302b is the period between the times t7 and t9. A decision as regards which type of pulse is present can be made only when a relatively longer or shorter pulse is read during the further progress to the pulse which was first of all read in.

In this respect, one embodiment proposes a method in which two sequences 310 and 311 of binary values are generated, in which case it is revealed only over the course of the decoding which of the sequences 310 and 311 should be used to determine the originally coded binary values. Two Manchester decoding operations are carried out for this purpose, in which case it is assumed in the first Manchester decoding that the second edge has been produced by coding a binary value. In contrast, it is assumed in the second Manchester decoding that the second signal edge is a correction edge.

In FIG. 3a, the signal 303 has a rising edge 304a at the time t1. The rising signal edge 304a can either represent a Manchester-coded logical value "1" (or a "0" if rising edges represent logical zeros according to the agreement) or may constitute a correction edge. It is assumed that the first received edge represents a value "1" coded by means of Manchester coding. According to first Manchester decoding, this "1" is now assigned to a first sequence 310.

It is also assumed for the second Manchester coding that the first edge represents the coding of a first binary value. For this reason, the decoded "1" of the edge 304a is also assigned to a second sequence 311.

At the time t2 in FIG. 3a, the signal 303 has a falling edge 305a. If the edge 305a has been produced by means of Manchester coding, the accordingly decoded binary value would be a logical "0" (or a "1" if falling edges represent logical ones according to the agreement) in this example. According to first Manchester decoding, this "0" is now assigned to the first sequence 310 again.

For the second Manchester coding, however, the edge 305a constitutes a correction edge. For this reason, no further value is transferred to the sequence 311 at the time t2.

In this procedure, the sequence 310 is generated by decoding each signal edge of the signal 303 and entering an accordingly generated binary value. However, only the binary value assigned to every second signal edge is stored for the purpose of generating the sequence 311.

In the example in FIG. 3a, the first sequence 310 then contains the binary values "1010101" and the second sequence 311 contains the binary values "1111" up to the time t7. With the occurrence of edge 305b at the time t8, it becomes clear that the current pulse 302b is a short pulse and the pulses (302a etc.) read in until then were long pulses. The previous decoding according to the first Manchester decoding therefore delivered correctly decoded binary values until the time t7. Since the signal edge 305b at the time t8 is a correction edge, the last "0" entered in sequence 310 is not a validly decoded binary value.

For the generation of the second sequence, it was assumed that the edges at the times t2, t4 and t6 are each correction edges. At the time t8, a signal edge is not allowed according to the second Manchester decoding. The signal edge 305b at the time t8 therefore constitutes a signal edge which is not allowed for the second Manchester decoding. The earliest next signal edge would be allowed at the time t9 for the second Manchester decoding. The entry "X" in the data sequence 311 symbolizes violation of the correct decoding caused by the edge at t8.

If the duty cycle of the pulses is approximately 50%, as illustrated in FIG. 3a, the measured relative duration of a high amplitude value of a pulse can already be used to decide which of the sequences 310 or 311 must be the sequence containing the valid Manchester-decoded data. The edge spacing t8-t7 which can be measured at t8 shows that a relatively short pulse was received and the previously received pulses therefore had relatively long pulse period durations by comparison. Both aspects show that it is possible to decide, at the time t8, that the sequence 310 constitutes a valid sequence of Manchester-decoded binary values.

In the exemplary embodiment shown in FIG. 3b, the signal profile 303 has pulses with a duty cycle of considerably less than 50%. In this case, it cannot yet be clearly decided at t8 whether the first sequence 310 or the second sequence 311 contains the validly decoded binary values. It becomes clear only with the renewed rise in the signal 303 at the time t9 that the sequence 310 must contain the valid values since otherwise no edge could have occurred at t9. The entry "X" in the data sequence 311 symbolizes violation of the correct decoding caused by the edge at t9.

For a signal profile as shown in the example in FIG. 3b, the sequence 310 contains the values "101010101" at the time t9. Since it becomes clear with the occurrence of the rising edge at t9 that a correction edge was present at the time t8, it is likewise clear that the value "0" stored in the sequence 310 at the time t8 is not a correctly decoded binary value. If the values stored in sequence 310 were used further, this "0" would therefore need to be removed.

Since it is unclear at the start of transmission or signal reception which of the two sequences 310 and 311 is the sequence containing the values which can be used further, the first sequence 310 is written to a first memory area and the second sequence 311 is written to a second memory area in a further exemplary embodiment. When it has been decided which of the two generated sequences 310 or 311 is the sequence containing the values which can be used further, work can be continued with the corresponding memory area containing the valid values.

In the described method which carries out two Manchester decoding operations or uses two different interpretations of signal edges, no value is lost. It is possible to dispense with complicated transmission of a special "header" when transmitting data from a transmitter to a receiver.

After the described method has been carried out, a memory area containing correctly Manchester-decoded binary values which can be used further automatically results.

The first memory area may have a size of 16, 32, 64 or 128 bits, for example. The second memory area may accordingly be half the size since, as a result of the described method, half as many binary values are generated in the second sequence 311 as in the first sequence 310. The memory areas may be assigned to a physical memory which is, for example, a register or a RAM (random access memory) or an NVM (non-volatile memory).

Since the values in the second sequence 311 are a subset of the values in the first sequence 310, only a shared memory area can also be used in one exemplary embodiment.

FIG. 4 shows another embodiment 400 with a signal profile 403 which starts from a low basic value 401 and has three data sequences 410, 411 and 412. The entry "c" shown in the data sequences 410, 411 and 412 in FIG. 4 does not represent an entered data item in a data sequence itself but rather symbolizes a correction edge possibly occurring at this time in the signal profile. The possibility of the occurrence of a correction edge depends on the interpretation of the signal profile 403. Three different cases are possible:

1.) The first two signal edges 404a and 405a are valid data edges and a correction edge "c" is possible in between.
2.) The first edge 404a and the third edge 406a are valid data edges and the second edge 405a is a correction edge "c".
3.) The first edge 404a is already a correction edge "c" and the second edge 405a is a valid data edge.

The data sequences 410, 411 and 412 are generated according to the three different cases. The data sequence 410 therefore contains the values "10101011" for the illustrated period since only values which do not belong to a correction edge are stored.

Accordingly, the data sequence 411 contains the values "1111" and the data sequence 412 contains the values "000".

In the present example, cases two and three are violated in the case of the edge 407a since no edge should occur in the signal 403 at the locations marked with "X". In this example, the data sequence 410 therefore constitutes the sequence containing the correctly Manchester-decoded binary values which can be used further. The entries in the data sequence 410 are used further and the data sequences 411 and 412 are rejected.

In another embodiment 500, FIG. 5 shows an example of a voltage profile in which the first pulses are now comparatively short pulses. The signal 503 has a rising edge 504a at the time t1. The signal edge 504a may have been produced, for example, by means of Manchester coding of a logical "1". This "1" is assigned to a first sequence 510 and to a second sequence 511. The signal 503 has a falling edge 505a at the time t2. The signal edge 505a may have been produced by means of Manchester coding of a logical "0". Therefore, the "0" again becomes part of the first sequence 510 but not part of the second sequence 511 since the second sequence is filled only with every second decoded binary value.

Including the time t5, the first sequence 510 then contains the binary values "10101" and the second sequence 511 contains the binary values "111". The second sequence 511 is a subset of the first sequence 510 since every second value in the first sequence 510 is transferred to the second sequence 511.

The binary values in the first sequence 510 are written to a first memory area (not illustrated in FIG. 5), for example. The binary values in the second sequence 511 are written to a second memory area (likewise not illustrated in FIG. 5), for example.

The binary values in the first sequence 510 and in the second sequence 511 may also be written to a shared memory; since the second sequence 511 is indeed a subset of the first sequence 510, it is possible to dispense with explicitly storing the second sequence 511 in this case.

No edge is detected at the time t6. In contrast, a falling edge is detected at the time t7, the associated binary value of which is again transferred to both sequences (510, 511). At the time t6, it can therefore be discerned that the first pulses, for example the pulse 502b, must have been a relatively short pulse, the falling edge of which does not represent a Manchester-decoded binary value at t2 but rather is only a falling edge in order to be able to again represent a rising edge with an accordingly decoded binary value at t3. In this case, the edge 505a is a correction edge. It is therefore shown that the values in the first sequence 510 do not contain Manchester-decoded values but rather the second sequence 511 contains correctly decoded binary values.

The edges of the pulses (502a, 502b) are each based on a basic value 501. In the case of a signal profile which would constantly correspond to the basic value 501, no data would be coded or transmitted. When starting data transmission, the pulses may fundamentally start from a high or low basic value. If the signal profile starts from a high basic value, an additional edge is needed to begin the decoding of valid Manchester-coded signals.

Figure 6:
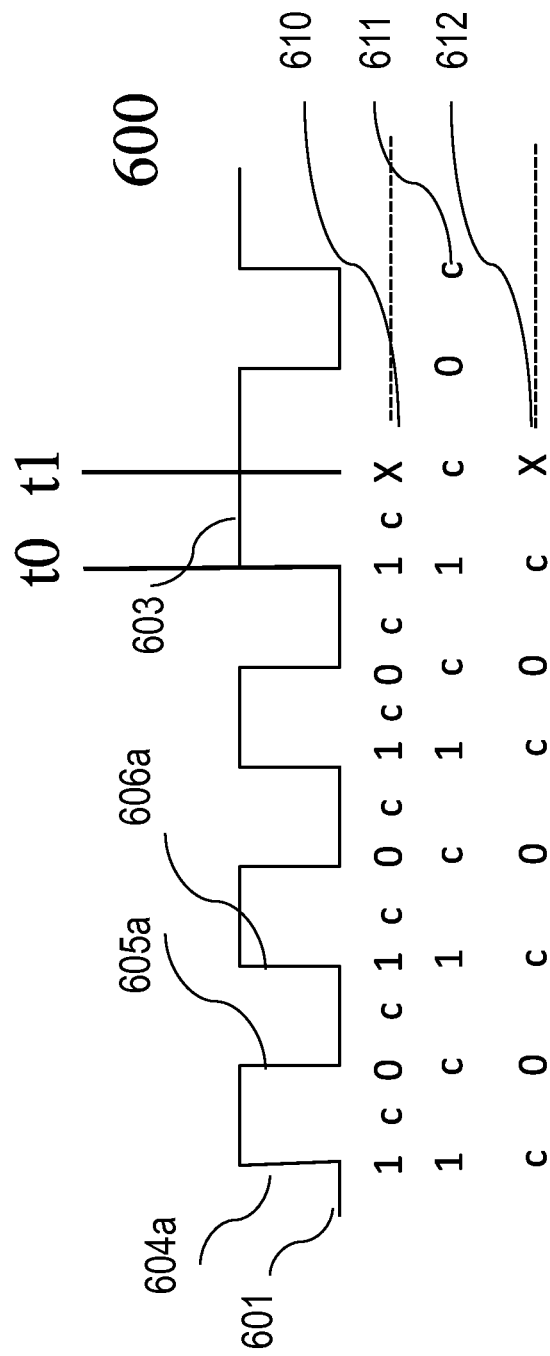
FIG. 6 shows one embodiment with three data sequences, the signal profile consisting of initially shorter pulses.

FIG. 6 shows another embodiment 600 with a signal profile 603 which starts from a low basic value 601 and has three data sequences 610, 611 and 612. The entry "c" shown in the data sequences 610, 611 and 612 in FIG. 6 does not represent an entered data item in a data sequence itself but rather symbolizes a correction pulse possibly occurring at this time in the signal profile. The possibility of the occurrence of a correction pulse depends on the interpretation of the signal profile 603. Three different cases are possible:

1.) The first two edges 604a and 605a are valid data edges and a correction edge "c" is possible in between.
2.) The first edge 604a and the third edge 606a are valid data edges and the second edge 605a is a correction edge "c".
3.) The first edge 604a is a correction edge and the second edge 605a is a valid data edge.

The data sequences 610, 611 and 612 are generated according to the three different cases. The data sequence 610 therefore contains the values "1010101", the data sequence 611 contains the values "1111" and the data sequence 612 contains the values "000" until the time t0. In the present example, the abovementioned cases 1) and 3) are violated at the time t1 since an edge must have occurred for these cases at t1.

The data sequences 610 and 612 are therefore marked with "X" at the time t1, that is to say the signal interpretation is violated here. In this example, the data sequence 611 therefore contains the sequence containing correctly Manchester-decoded binary values which can be used further. The entries in the data sequence 611 are used further and the data sequences 610 and 612 are rejected.

Figure 7:
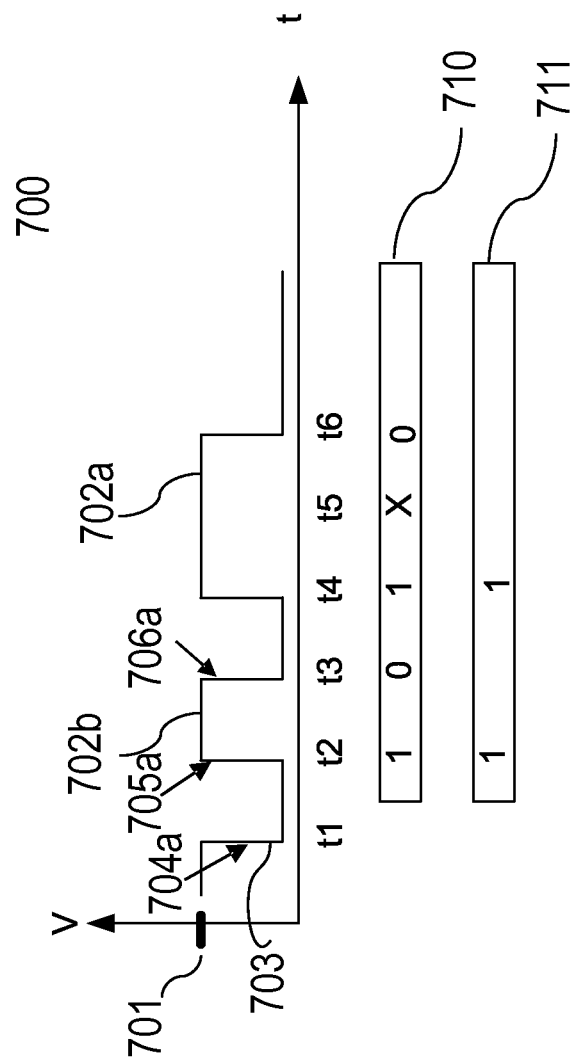
FIG. 7 shows one embodiment with two data sequences, the signal profile having a high basic value.

In another embodiment 700, FIG. 7 shows a signal profile in which the basic value 701 has a high level. The signal 703 has a falling edge 704a at the time t1. If the first detected edge is a falling edge, the signal profile 703 is started from a high basic value 701 in the observation period. In this exemplary embodiment, the detected falling edge 704a does not represent a decoded binary value.

The signal 703 has a rising edge 705a at the time t2. The signal edge 705a may represent a coded binary value, for example a logical "1". This "1" becomes part of a first sequence 710 and part of a second sequence 711. The signal 703 has a falling edge 706a at the time t3. The signal edge 706a may represent a coded binary value "0". This "0" again becomes part of the first sequence 710 but not part of the second sequence 711 since the second sequence is filled only with every second decoded binary value. Including the time t6, the first sequence 710 then contains the binary values "1010" and the second sequence 711 contains the binary values "11". The second sequence 711 is a subset of the first sequence 710 since every second value in the first sequence 710 is transferred to the second sequence 711.

It can therefore be discerned at the time t6 that the first pulses, for example the pulse 702b, must have been a relatively short pulse, the falling edge of which does not represent a Manchester-decoded binary value at t3 but rather is only a falling edge in order to be able to again represent a rising edge with an accordingly decoded binary value at t4. The edge 706a is a correction edge in this case. It is therefore shown that the values in the first sequence 710 do not contain Manchester-decoded values but rather the second sequence 711 constitutes the sequence with the correctly decoded binary values.

The decision as regards which of the generated sequences contains correctly Manchester-decoded binary data which can be used further is made as soon as a second pulse length is detected in the observation period. This second pulse length is either considerably shorter or considerably longer than a first pulse length. The first pulse length corresponds to the duration of the first pulse measured in the observation period. In this case, the pulse length can be determined using the interval of time between a falling edge and a rising edge or between a rising edge and a falling edge.

In another embodiment, three edges of the signal profile and the time in between in each case are analyzed. That is to say, the decoded binary values are assigned to the respective sequences as long as the edge spacings are substantially the same. This operation is repeated until a new edge spacing results, which edge spacing is either considerably shorter or longer than a previous edge spacing. In this case, a decision is made as regards which sequence of binary data is processed further or is forwarded to downstream functional units.

Figure 8:
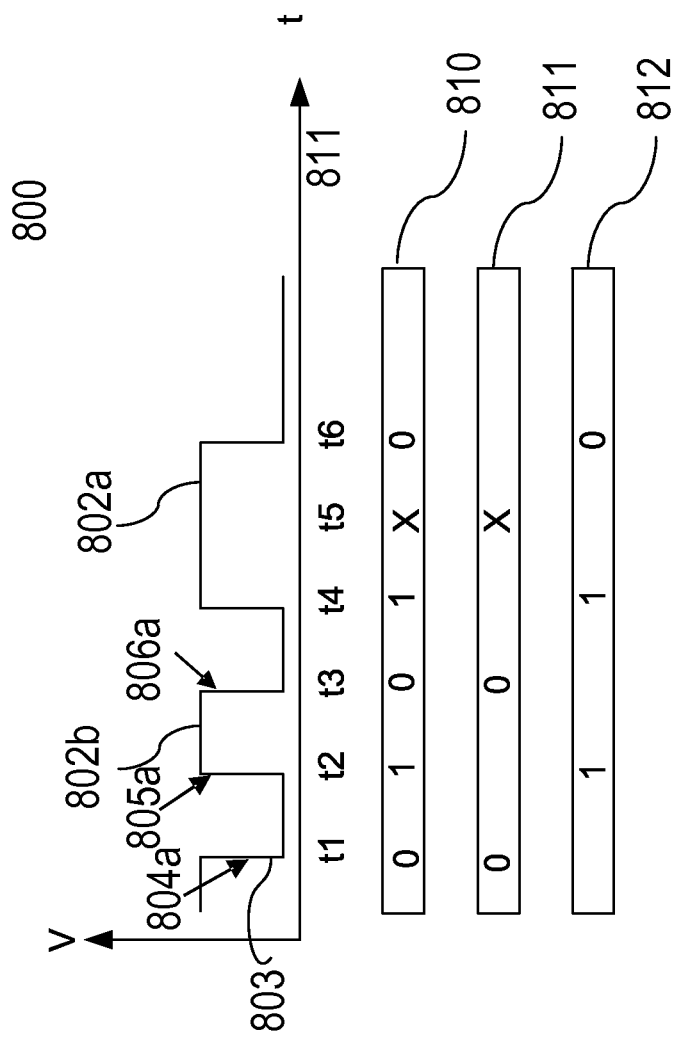
FIG. 8 shows one embodiment with three data sequences, the signal profile having a high basic value.

FIG. 8 shows an embodiment which manages without a predefined basic value. As in the previous exemplary embodiments, the signal profile 803 is first of all analyzed and the detected signal edges 804a, 805a etc. are interpreted according to possibly underlying first Manchester coding or second Manchester coding and the corresponding binary values are stored in sequences. A first sequence 810 having the values "0101" and a second sequence 811 having the values "00" are produced, for example, including the time t4.

FIG. 8 now shows a further sequence 812 in which the second values in the first sequence 810 are likewise each entered, but with an offset of one value. The further sequence 812 is therefore written to at the times t2, t4 etc., that is to say the value in the first sequence 810 at the time t2 is entered in the sequence 812 at the time t2 etc.

In the exemplary embodiment in FIG. 8, a decision can already be made at t5 that the first sequence 810 is not a sequence containing valid Manchester-decoded binary values since an edge would then have had to be detected in the signal profile 800 at t5 at the latest.

The same also applies to the second sequence 811, that is to say an edge would have had to be detected in the signal profile 800 at t5 at the latest. This results in only the sequence 812 being able to be the sequence containing the valid Manchester-decoded binary values. These are the values "110" in this case.

Figure 9:
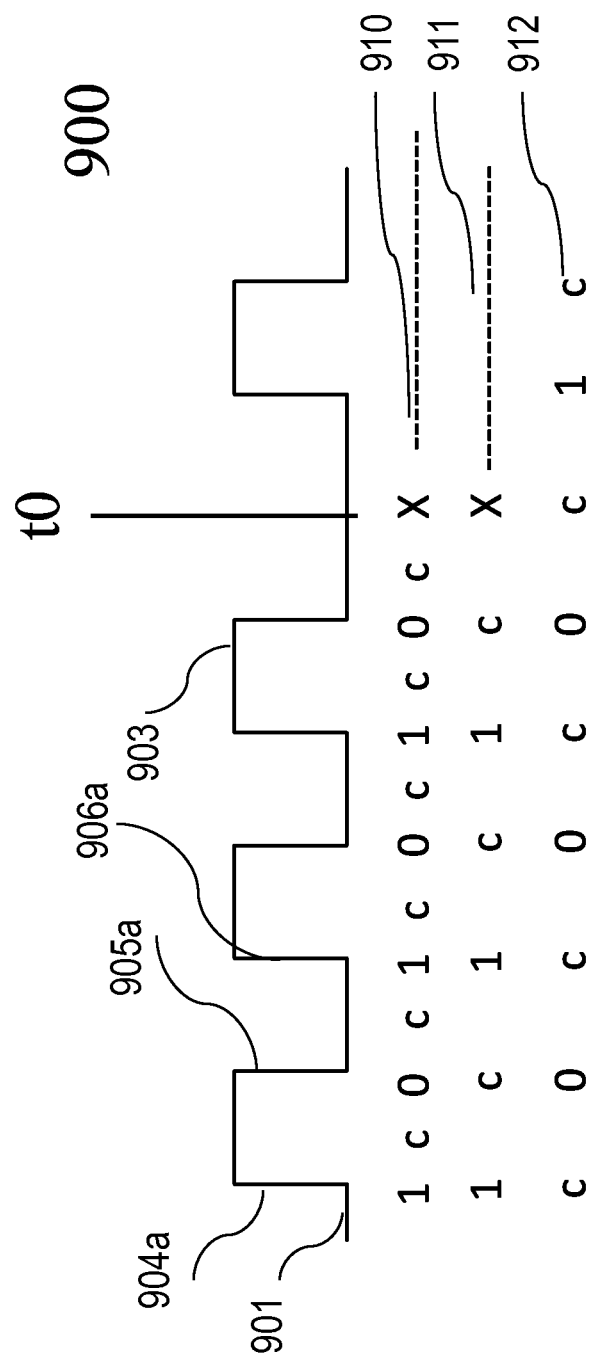
FIG. 9 shows another embodiment with three data sequences.

FIG. 9 shows another embodiment 900 with a signal profile 903 which starts from a low basic value 901 and has three data sequences 910, 911 and 912. The entry "c" shown in the data sequences 910, 911 and 912 in FIG. 9 does not represent an entered data item in a data sequence itself but rather symbolizes a correction edge possibly occurring at this time in the signal profile. The possibility of the occurrence of a correction edge depends on the interpretation of the signal profile 903. Three different cases are possible:

1.) The first two edges 904a and 905a are valid data edges and a correction edge "c" is possible in between;
2.) The first edge 904a and the third edge 906a are valid data edges and the second edge 905a is a correction edge "c";
3.) The first edge 904a is a correction edge "c" and the second edge 905a is a valid data edge;

The data sequences 910, 911 and 912 are generated according to the three different cases. The data sequence 910 therefore contains the values "101010", the data sequence 911 contains the values "111" and the data sequence 912 contains the values "000" until the time t0. In the present example, cases 1) and 2) are violated at the time t0 since a signal edge would be required at t0 for these cases.

The data sequences 910 and 911 are therefore marked with "X" at this location, that is to say the signal interpretation is violated here. In this example, the data sequence 912 therefore constitutes the sequence containing correctly Manchester-decoded binary values. The entries in the data sequence 912 are used further and the data sequences 910 and 911 are rejected.

The advantage of the described method with its different embodiments is that, when the correct clock of the coded binary data is detected, the correctly decoded values which can be used further are already present. However, if a defined bit pattern ("preamble") is used to detect the clock, the actual transmission of useful data is possible only with a certain temporal offset which depends on the length of the preamble. The European patent specification EP0266285B1 discloses a method in which the problem of fast clock detection is solved by introducing a deliberate pulse extension into the signal at the start of data transmission. The length of a preamble can therefore be shortened but it nevertheless remains necessary. The disclosed method results in a speed advantage in data transmission systems since it is possible to completely dispense with a preamble.

Figure 10:
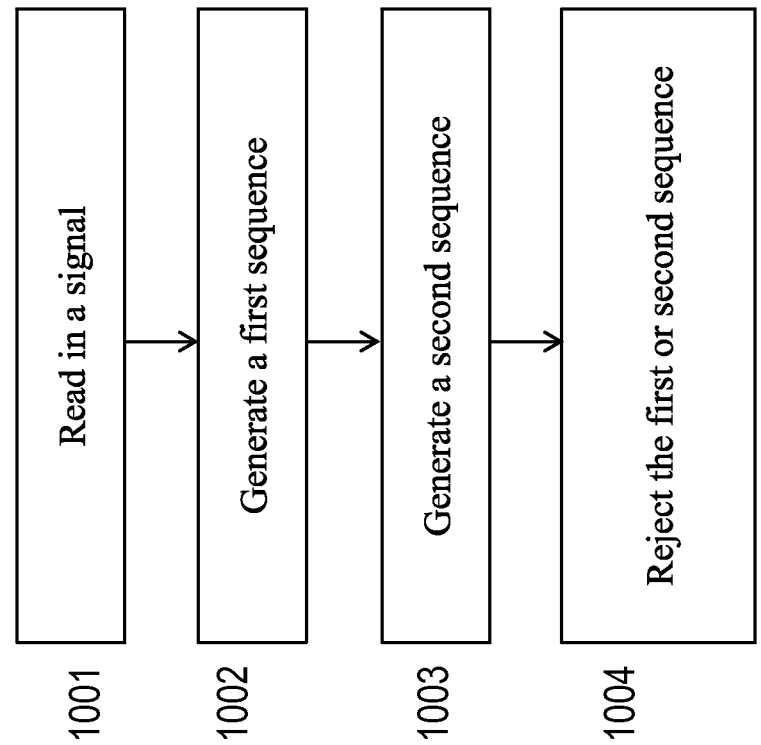
FIG. 10 shows one exemplary embodiment of a method according to the invention.

FIG. 10 shows the essential steps of the described method for generating a sequence of Manchester-decoded binary data. In the first step 1001, the coded, analog signal should be read in. The signal was generated, for example, by supplying a sequence of bits or binary data and a clock signal to an XOR (exclusive OR) gate. A signal is read in in step 1001 by storing it in a memory element, for example. The edges of the signal which has been read in are then detected and a first sequence is generated by means of first Manchester decoding. During this first decoding, a binary value is assigned to each signal edge. A rising edge may represent a logical bit "1" and a falling edge may represent a logical bit "0".

In step 1003, a second sequence is then generated with the aid of second Manchester decoding. During the second Manchester decoding, a binary value is assigned only to every second signal edge.

If the amplitude of the signal is at a high basic value at the beginning of the observation period, the first sequence begins only with a binary value which is assigned to a first rising edge.

In step 1004, one of the two generated sequences is now rejected. This decision is made by identifying the correct clock frequency used during the coding through the occurrence of allowed signal edges or the absence of required signal edges.

What is claimed is:

1. A method for generating Manchester-decoded binary values, comprising:
   reading in a signal having signal edges;
   generating a first sequence of decoded binary values by means of a first Manchester decoding, in which a decoded binary value is allocated to each signal edge of the signal;
   generating a second sequence of decoded binary values by means of a second Manchester decoding, in which a decoded binary value is allocated to each second signal edge of the signal;
   rejecting the second sequence if a signal edge of the signal which is not allowed with respect to the second Manchester decoding occurs; and
   rejecting the first sequence if a signal edge of the signal which is required with respect to the first Manchester decoding is missing.

2. The method as claimed in claim 1, wherein the first value in the second sequence either corresponds to the first value in the first sequence, or the first value in the second sequence corresponds to the second value in the first sequence.

3. The method as claimed in claim 1, further comprising:
   storing the first sequence in a first memory area and storing the second sequence in a second memory area.

4. The method as claimed in claim 3, wherein the first memory area and/or the second memory area is/are formed by a register or a random access memory (RAM) or a non-volatile memory (NVM).

5. The method as claimed in claim 1, further comprising:
   storing the first sequence and the second sequence in a first memory area.

6. The method as claimed in claim 1, further comprising:
   generating a third sequence, wherein the first value in the second sequence corresponds to the first value in the first sequence and the first value in the third sequence corresponds to the second value in the first sequence.

7. The method as claimed in claim 6, further comprising:
   storing the third sequence in a third memory area.

8. The method as claimed in claim 1, wherein the signal has pulses of different durations and the signal represents a sequence of Manchester-coded binary values.

9. The method as claimed in claim 1, wherein the signal has a basic value and the generation of the first and second sequences begins only with the occurrence of a rising signal edge if the basic value has a high level.

10. The method as claimed in claim 1, wherein the signal edges are either rising or falling, wherein a binary value of "1" corresponds to a rising edge and a binary value of "0" corresponds to a falling signal edge.

11. The method as claimed in claim 1, wherein the signal edges are either rising or falling, wherein a binary value of "0" corresponds to a rising edge and a binary value of "1" corresponds to a falling signal edge.

12. An apparatus for decoding Manchester-coded signals, comprising:
   means for reading in a signal having signal edges;
   a decoder configured to allocate a decoded binary value to each signal edge of the signal during first Manchester decoding, and configured to generate a first sequence comprising each decoded binary value, and wherein the decoder is further configured to generate a second sequence containing only every second decoded binary value during a second Manchester decoding, and
   means for rejecting the first sequence or the second sequence, wherein the rejecting means is configured to reject the second sequence if a signal edge of the signal which is not allowed with respect to the second Manchester decoding occurs, and
   wherein the rejecting means is also configured to reject the first sequence if a signal edge of the signal required with respect to the first Manchester decoding is missing.

13. The apparatus as claimed in claim 12, wherein the apparatus also comprises a memory unit which is configured to store the generated sequences of data.

14. The apparatus as claimed in claim 12, wherein the apparatus is configured to indicate the sequence containing valid Manchester-decoded binary values.

15. A system, comprising:
   a transmitter configured to transmit a Manchester-coded signal; and
   a receiver configured to decode the Manchester-coded signal, wherein the receiver comprises:
     means for reading in a signal having signal edges;
     a decoder configured to allocate a decoded binary value to each signal edge of the signal during first Manchester decoding, and configured to generate a first sequence comprising each decoded binary value, and wherein the decoder is further configured to generate a second sequence containing only every second decoded binary value during a second Manchester decoding, and
     means for rejecting the first sequence or the second sequence, wherein the rejecting means is configured to reject the second sequence if a signal edge of the signal which is not allowed with respect to the second Manchester decoding occurs, and
     wherein the rejecting means is also configured to reject the first sequence if a signal edge of the signal required with respect to the first Manchester decoding is missing.

16. A microprocessor configured to access a memory in which is stored executable instructions, and upon executing the executable instructions is configured to:
   read in a signal having signal edges;
   generate a first sequence of decoded binary values by means of a first Manchester decoding, in which a decoded binary value is allocated to each signal edge of the signal;
   generate a second sequence of decoded binary values by means of a second Manchester decoding, in which a decoded binary value is allocated to each second signal edge of the signal;
   reject the second sequence if a signal edge of the signal which is not allowed with respect to the second Manchester decoding occurs; and
   reject the first sequence if a signal edge of the signal which is required with respect to the first Manchester decoding is missing.

17. A subassembly having a microprocessor which is configured to access a memory in which is stored executable instructions, and upon executing the executable instructions is configured to:
- read in a signal having signal edges;
- generate a first sequence of decoded binary values by means of a first Manchester decoding, in which a decoded binary value is allocated to each signal edge of the signal;
- generate a second sequence of decoded binary values by means of a second Manchester decoding, in which a decoded binary value is allocated to each second signal edge of the signal;
- reject the second sequence if a signal edge of the signal which is not allowed with respect to the second Manchester decoding occurs; and
- reject the first sequence if a signal edge of the signal which is required with respect to the first Manchester decoding is missing.

* * * * *